United States Patent [19]

Roman

[11] Patent Number: 5,580,831
[45] Date of Patent: Dec. 3, 1996

[54] SAWCUT METHOD OF FORMING ALIGNMENT MARKS ON TWO FACES OF A SUBSTRATE

[75] Inventor: James J. Roman, Milpitas, Calif.

[73] Assignee: Fujitsu Limited, Japan

[21] Appl. No.: 98,579

[22] Filed: Jul. 28, 1993

[51] Int. Cl.$^6$ ................................... H01L 21/02
[52] U.S. Cl. .................. 437/249; 83/33; 83/36; 83/39; 83/862; 83/875; 148/DIG. 28
[58] Field of Search ............... 83/862, 863, 875, 83/876, 869, 879, 880, 33, 34, 35, 36, 39, 56; 51/5 B, 283 R, 283 E; 437/226, 227, 249; 149/DIG. 28, DIG. 115; 451/41, 44

[56] References Cited

U.S. PATENT DOCUMENTS

| | | | |
|---|---|---|---|
| 2,970,730 | 2/1961 | Schwarz | 83/880 X |
| 3,897,627 | 8/1975 | Klatskin | 437/226 |
| 4,356,223 | 10/1982 | Iida et al. | 428/156 |
| 4,371,598 | 2/1983 | Medernach et al. | 430/22 |
| 4,423,959 | 1/1984 | Nakazawa et al. | 356/400 |
| 4,534,804 | 8/1985 | Cade | 148/1.5 |
| 4,547,446 | 10/1985 | Tam | 430/22 |
| 4,814,296 | 3/1989 | Jedlicka et al. | 437/226 |
| 4,822,755 | 4/1989 | Hawkins et al. | 437/226 X |
| 4,900,283 | 2/1990 | Fukae | 437/226 X |
| 4,914,829 | 4/1990 | Keaton | 33/613 |
| 4,937,162 | 6/1990 | Goirand et al. | 430/22 |
| 5,128,280 | 7/1992 | Matsumoto et al. | 437/203 |
| 5,128,282 | 7/1992 | Ormond et al. | 437/226 |
| 5,174,188 | 12/1992 | Petroz | 83/880 X |
| 5,182,233 | 1/1993 | Inoue | 437/226 |
| 5,196,378 | 3/1993 | Bean et al. | 148/DIG. 28 X |
| 5,279,992 | 1/1994 | Maejima et al. | 437/249 X |
| 5,284,792 | 2/1994 | Forster et al. | 437/226 X |
| 5,302,554 | 4/1994 | Kashiwa et al. | 437/226 X |
| 5,393,706 | 2/1995 | Mignardi et al. | 437/227 X |

FOREIGN PATENT DOCUMENTS

| | | | |
|---|---|---|---|
| 191480 | 11/1983 | Japan | 225/2 |
| 220947 | 12/1984 | Japan | 437/226 |
| 5-267112 | 10/1993 | Japan | 437/249 |

*Primary Examiner*—Rinaldi I. Rada
*Assistant Examiner*—Clark F. Dexter
*Attorney, Agent, or Firm*—Coudert Brothers

[57] ABSTRACT

The present invention is a method for producing alignment marks on opposite faces of a generally flat substrate such as a semiconductor wafer. First, reference cuts are produced at the edges of the substrate at four points around the wafer. Next, the center line is determined on the first face of the substrate between two oppositely disposed reference cuts. First and second grooves are then cut in the first face of the substrate a first predetermined distance from the first center line. Third and fourth grooves are cut in the first face perpendicular to and through the first and second grooves at the first predetermined distance from the second reference cut forming crosshair alignment patterns. Next, the center line is determined on the second face of the substrate between the third and fourth reference cuts, and fifth and sixth grooves are cut in the second face of the substrate a second predetermined distance from the second center line. Finally, seventh and eighth grooves are cut in the second face of the substrate perpendicular to and through the fifth and sixth grooves at the second predetermined distance from the second reference cut. Thus, pairs of crosshairs are located on opposite faces of the substrate based upon reference cuts easily locatable from either side. In a preferred embodiment, the first and second predetermined distances are different from one another, to allow the cuts on opposite faces to be offset to prevent mechanical failure.

6 Claims, 5 Drawing Sheets

SAWCUT METHOD OF FORMING ALIGNMENT MARKS ON TWO FACES OF A SUBSTRATE

FIELD OF THE INVENTION

The present invention relates generally to the field of generation of selected patterns on substrate materials, and more particularly to a method for aligning patterns on opposed surfaces of a substrate such as a silicon wafer.

BACKGROUND OF THE INVENTION

The manufacture of semiconductor devices and device carriers often requires the patterning of layers of materials that are deposited upon a substrate, such as a silicon wafer. In such processes a mask is generally used to form the pattern on the substrate. Since many devices comprise a number of different layers, it is necessary to precisely align the mask so that features on the various layers will have a predetermined relative position. In addition, it is important that alignment relative to the center of the substrate is precisely known so that optimal use of the surface of the substrate may be made. If the pattern is offset from the true center of the substrate features may be formed too close to the edge of the substrate or fixturing problems may arise in subsequent process steps.

It is often desirable to produce patterns upon both faces of a substrate; and, in such cases, a pattern on one face of the substrate often must correspond in some manner to the pattern on the opposite face of the substrate, as when elements disposed on the opposite faces need to be electrically or physically coupled. Careful alignment of the patterns on opposite faces of the substrate is necessary for the elements to be formed in the proper relative positions. For example, a signal line on one face of a substrate may be connected to a corresponding signal line on the opposite face of the substrate by a via that is formed through the substrate. In such a case, the two signal lines and the via must all be precisely aligned relative to one another. Hence, the precise alignment of patterns on opposite faces of a substrate is a required element of certain manufacturing processes.

A typical prior art method for obtaining precise alignment of patterns on both faces of a substrate uses sophisticated, relatively expensive, special-purpose machinery to mechanically align the patterning devices for the top and bottom faces of the substrate. Alternatively, Goirand, U.S. Pat. No. 4,937,162, discloses use of optically aligned mirrors to pattern the substrate coating. In either case, the machinery used is expensive and difficult to maintain, and therefore is not practical in many settings. In addition, the level of precision offered by such devices is unnecessary for certain applications which, nevertheless, require careful alignment of patterns. For example, in the manufacture of chip carriers, including multichip modules, the features are not as fine as those in a typical high density integrated circuit chip.

Other methods have been proposed using specific machinery with substrates having specialized physical properties, such as translucency as taught by Medernach in U.S. Pat. No. 4,371,598, or photoreactive doped materials as taught by Cade, U.S. Pat. No. 4,534,804. The use of such substrates permits construction of specialized devices to be used specifically with those substrates. Such methods are not general in nature, and, again, necessitate use of costly equipment which is often not justified by economic factors.

The present invention, therefore, is directed to a method for aligning patterns on opposite faces of a substrate which does not require expensive, specialized equipment for performing such an alignment. The method of the present invention can be performed using common equipment, without need for extensive reconfiguration of the equipment, particularly during use, as such reconfiguration would necessarily slow the manufacturing process. Extensive reconfiguration could lead to such delay and additional costs that would make it no more economical than use of specialized manufacturing machinery, as described above.

Accordingly, it is an object of the present invention to provide an improved method of aligning patterns on a substrate.

Another object of the present invention is to provide a method of aligning patterns on a substrate using common machining equipment with minimal reconfiguration of the equipment.

These and other objects of the present invention will become apparent to those skilled in the art from the following description and accompanying claims and drawings.

SUMMARY OF THE INVENTION

The present invention comprises a method for producing alignment marks on opposite faces of a generally flat substrate having a predetermined reference position on an edge of the substrate. Preferably, the reference position is a cut on the edge of the substrate, said cut having a "clean" edge. The reference cut may be preexisting on the substrate, such as a wafer "flat," or may be formed as a first step in the method of the present invention. In either case, in the preferred embodiment, a second reference cut is produced on the substrate parallel to the first reference cut but on the opposite edge of the substrate. Next, third and fourth reference cuts are produced in the substrate perpendicular to the lines of the first and the second reference cuts. The third and fourth reference cuts are parallel to one another but on opposite edges of the substrate. A substrate center line is then determined between the third and fourth reference cuts. Next, first and second grooves are cut in the first face of the substrate a first predetermined distance from the center line. The first and second grooves are, thus, parallel to the third and fourth reference cuts. Third and fourth grooves are cut in the first face perpendicular to and through the first and second grooves at a predetermined distance from the second reference cut, forming a first pair of crosshair alignment grooves on the first face of the substrate. Next, fifth and sixth grooves are cut in the second face of the substrate a second predetermined distance from the center line. The fifth and sixth grooves are, thus, also cut parallel to said third and said fourth reference cuts. Finally, seventh and eighth grooves are cut in the second face of the substrate perpendicular to and through the fifth and sixth grooves a predetermined distance from the second reference cut, forming a second pair of crosshair alignment grooves on the second face of the substrate. The position of the crosshair alignment grooves on both faces of the substrate is, thus, precisely known relative to the true center of the substrate.

In the preferred embodiments of the present invention, the first and second predetermined distances are varied to allow the cuts on opposite faces to be offset. Such an arrangement lessens the risk of mechanical failure which could result when the alignment marks overlie one another.

DETAILED DESCRIPTION OF THE INVENTION

The method of the present invention is best understood through an exemplary process with stages illustrated in FIGS. 1–8, common elements of the figures being denoted with the same numerals. For purposes of the following discussion, substrate 10 is shown as a disk-shaped "wafer" of semiconductor material, such as silicon, having a precut wafer "flat." Commercially available semiconductor wafers typically come with a preformed flat cut therein. While the present invention is herein described in connection with a semiconductor wafer, it will be apparent to those skilled in the art that the present invention may be used with other substrates, such as those formed from ceramic, and that the substrate need not be disk-shaped.

According to the preferred method of the present invention, the wafer flat is recut to form a first reference cut 12 having a clean edge, i.e., an edge that is sufficiently straight and distinct to serve as a clear reference for determining orientation and distances on the disk. In a less preferred embodiment the precut flat is not recut, and serves as the first reference cut. This approach is acceptable when less accuracy is needed and, accordingly, the flat has a sufficiently accurate edge to serve as the first reference cut of the present invention.

Figure 1:
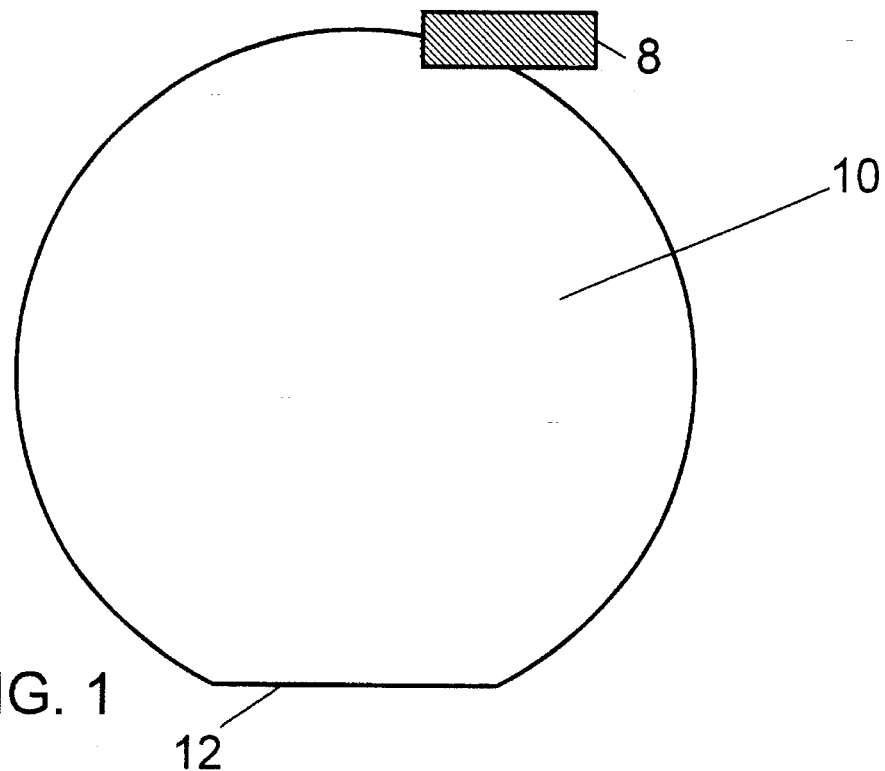
FIG. 1 illustrates the creation of a second reference cut in a wafer.

According to the preferred method of the present invention, a second reference cut 14 is then produced on the wafer 10 parallel to first reference cut 12 but on the opposite edge of wafer 10 from first reference cut 12. As shown in FIG. 1, this cut may be made by a saw 8 oriented parallel to the first reference cut 12. Both first reference cut 12 and second reference cut 14 may be made simultaneously using a saw 8 having parallel blades, or may be made sequentially by translating a single bladed saw. Preferably, second reference cut 14 is made so as to remove as little material as possible while providing a reference sufficiently long to enable subsequent measurement and orientation as described below. Saw 8, which may be used to make all of the cuts and grooves described herein, may be a common dicing saw of the type used in semiconductor device fabrication. Such a saw is relatively inexpensive in comparison to the highly specialized equipment otherwise required for precisely aligning patterns on two sides of a substrate, and is likely to be useful for other purposes. In a typical use of the method of the present invention, saw 8 has one or two 25-micron wide blade(s).

Figure 2:
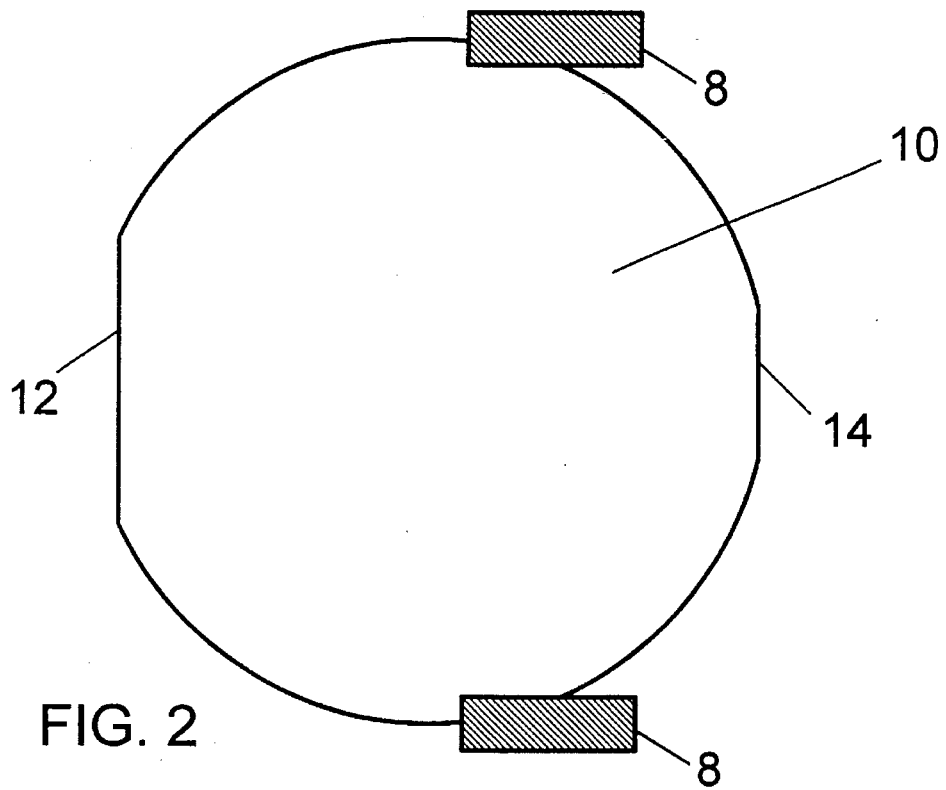
FIG. 2 illustrates the creation of third and fourth reference cuts in the wafer.
Figure 3:
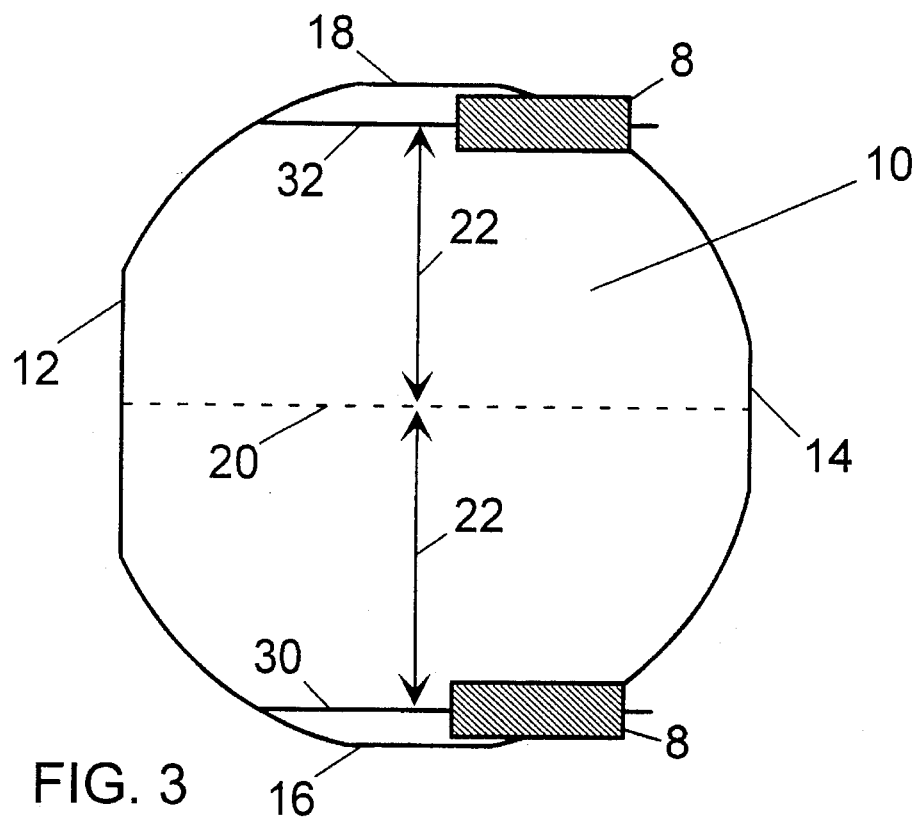
FIG. 3 illustrates cutting of first and second grooves in the first side of the wafer.

Next, a third reference cut 16 and a fourth reference cut 18 are made on wafer 10 perpendicular to the lines defined by first reference cut 12 and second reference cut 14, as shown in FIGS. 2 and 3. Thus, third and fourth reference cuts 16, 18 are parallel to one another but on opposite edges of wafer 10. In the preferred implementation of the method of the present invention, third reference cut 16 and fourth reference cut 18 are made by first rotating wafer 10 by a quarter-turn, i.e., ninety degrees, and then making the cuts. The cuts themselves may be made by a saw having parallel blades disposed upon opposite sides of wafer 10, or may be made by translating a single saw blade between the two sides while maintaining the proper alignment. Preferably, third reference cut 16 and fourth reference cut 18 are made so as to remove as little of the substrate material as possible, while providing reference cuts sufficiently long to enable subsequent measurement and orientation based upon their location and orientation.

FIG. 3 illustrates the preferred manner in which a first set of grooves on the first face of wafer 10 are formed according to the present invention. A center line 20 is located on the first face of wafer 10 between and parallel to third reference cut 16 and fourth reference cut 18. Next, saw 8 is positioned a first predetermined distance from center line 20 toward third reference cut 16, the displacement being represented as displacement 22. A first groove 30 is then cut parallel to first center line 20 but displaced by the first predetermined distance. Then saw 8 is displaced by the same first predetermined distance from center line 20 toward fourth reference cut 18. A second groove 32 is then cut parallel to center line 20 but displaced by the first predetermined distance. Therefore, center line 20, third reference cut 16, fourth reference cut 18, first groove 30 and second groove 32 are all parallel to one another. Although, for convenience this has been described as a series of steps, first groove 30 and second groove 32 may be cut simultaneously by parallel saw blades. Alternatively, they may be cut sequentially by displacing a single saw blade. Preferably, first and second grooves 30, 32, are located near the edge of the wafer in order to maximize the wafer area available for use. In the illustrated embodiment, for a six-inch diameter wafer, grooves 30 and 32 are each located 70 mm from center line 20. When used to form grooves, saw 8 is typically set to cut grooves 5–15 microns deep and 35–40 microns wide.

Figure 4:
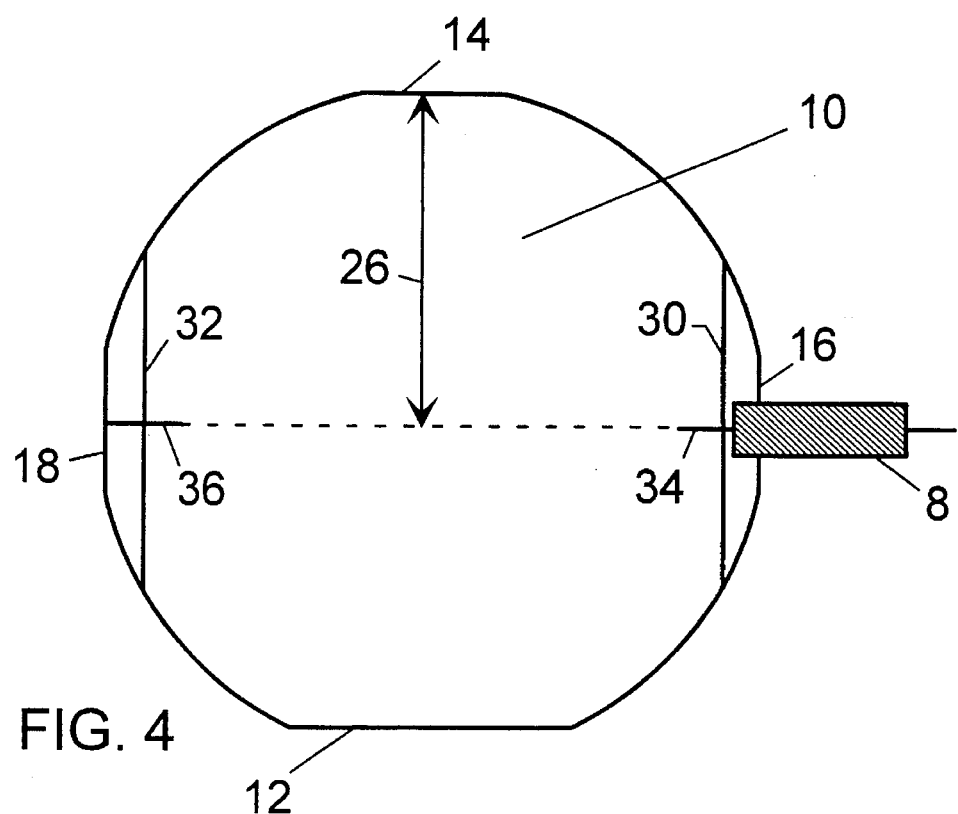
FIG. 4 illustrates cutting of third and fourth grooves in the first side of the wafer.

Next, additional grooves are cut to create a first set of crosshairs on the first face of the wafer which will be used for aligning the mask. This is illustrated in FIG. 4. Saw 8 is positioned with an orientation such that it cuts parallel to first reference cut 12 and second reference cut 14, and is displaced from second reference cut 14 by a displacement 26. Preferably, displacement 26 is selected so that the resulting crosshairs are near an imaginary center line running between and parallel to first and second reference cuts 12, 14. For convenience, displacement 26 may also be selected to be equal to the first predetermined distance discussed above, in which case it will be equal in length to displacement 22. In the preferred embodiment, when cutting these grooves, the wafer 10 is rotated by a quarter turn while saw 8 is maintained in a constant alignment. The advantage of such an arrangement is that the orientation of saws 8 need not be changed, with only a translation being necessary to position saw 8.

Once the saw 8 is positioned, the crosshairs are created by cutting a third groove 34 and a fourth groove 36. The manner in which this is performed is illustrated in FIG. 4. In the illustrated embodiment, saw 8 is first positioned over third reference cut 16 and third groove 34 is cut toward the center of wafer 10 such that the cut extends past first groove 30. Next saw 8 is positioned over fourth reference cut 18 and fourth groove 36 is cut toward the center of wafer 10 such that the cut extend past second groove 32. Saw 8 may be moved from cutting third groove 34 to fourth groove 36 either by lifting the blade up and translating the blade along the line of the blade or by rotating wafer 10 by a half turn, i.e., 180 degrees, depending upon the capabilities of the particular saw used. It should be apparent that third groove 34 is perpendicular to and passes through first groove 30, and fourth groove 36 is perpendicular to and passes through second groove 32. In one embodiment, third groove 34 and fourth groove 36 are cut to a length of 2 cm, have a width of 35–40 microns and have a depth of 5–15 microns.

Figure 5:
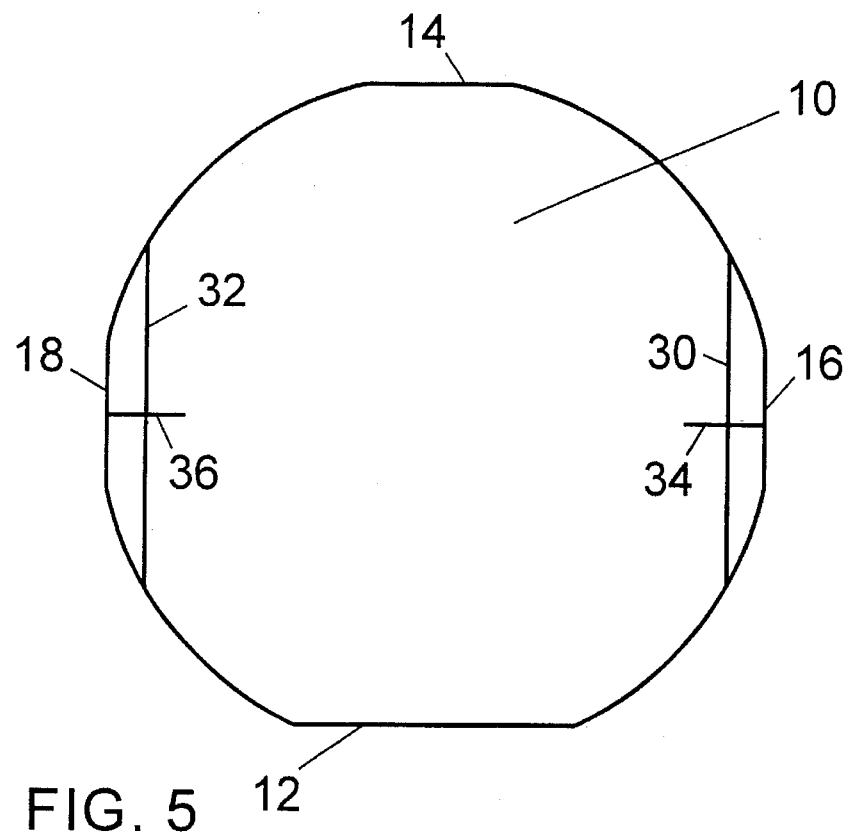
FIG. 5 illustrates the first side of the wafer after creation of the crosshair patterns.

The above method results in a pair of crosshair lines cut into one face of substrate 10 at predetermined locations which were created without cutting or otherwise affecting the central portion of the substrate surface. These crosshairs are shown in FIG. 5, which illustrates the final result of this process for one face of substrate 10.

Figure 6:
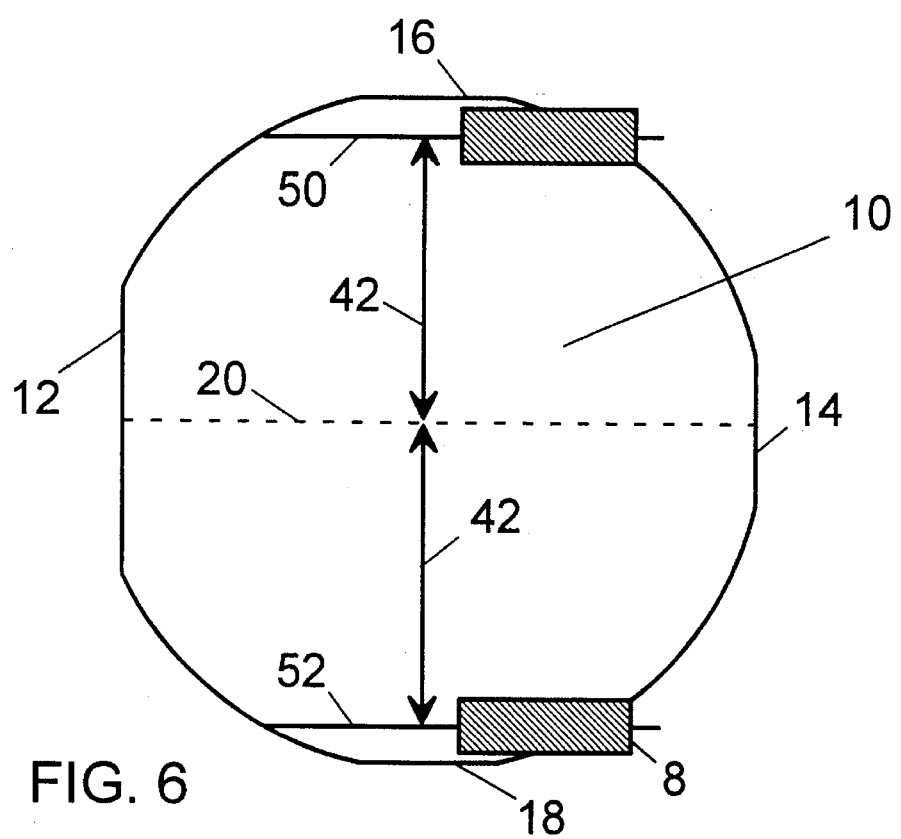
FIG. 6 illustrates cutting of fifth and sixth grooves in the second side of the wafer.
Figure 7:
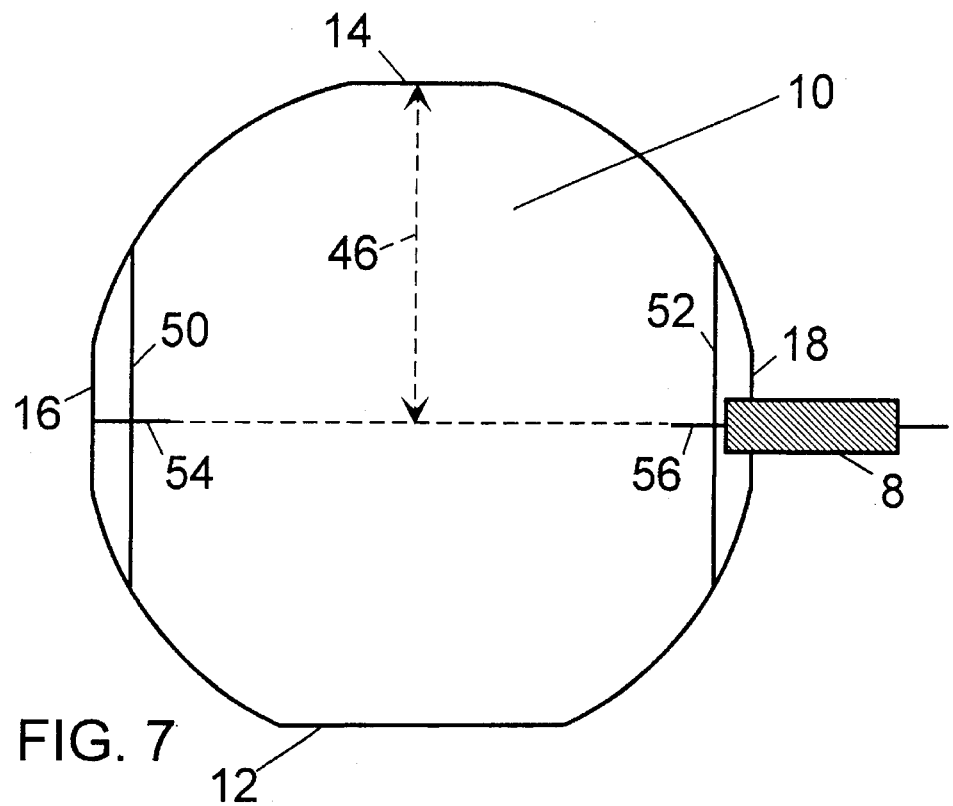
FIG. 7 illustrates cutting of seventh and eighth grooves in the second side of the wafer.
Figure 8:
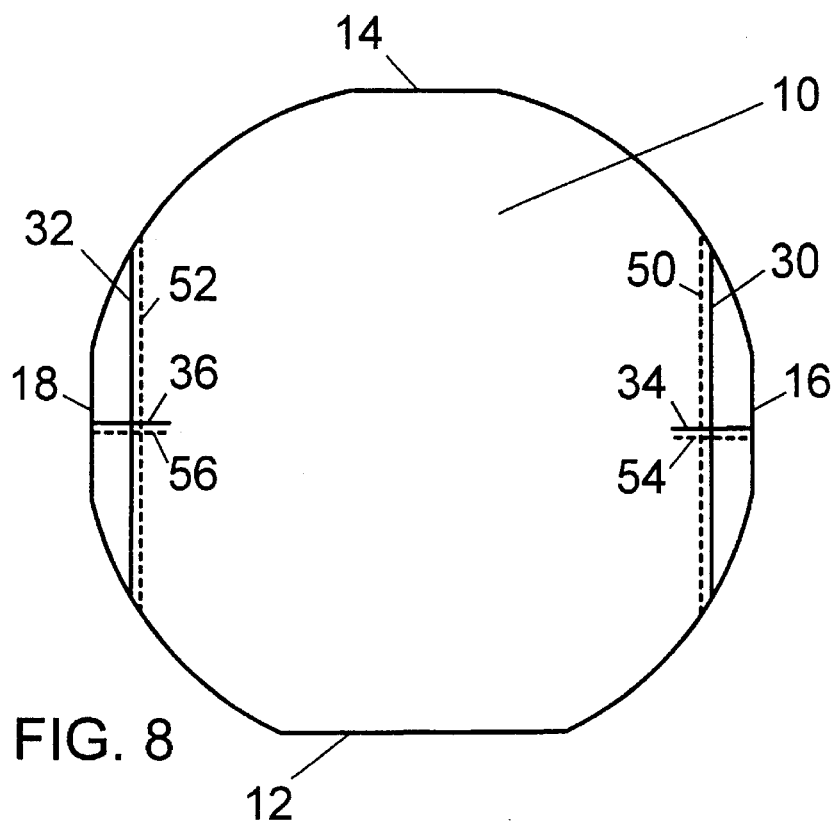
FIG. 8 illustrates an offset placement of the crosshair patterns on opposite sides of the wafer.

In order to produce an aligned pattern on the opposite face of substrate 10, the steps of FIGS. 3–4 must be repeated for the opposite face of substrate 10, as shown in FIGS. 6–8. Thus, center line 20 is located on the second face of wafer 10 between third and fourth reference cuts 16, 18, as shown in FIG. 6. Fifth groove 50 and sixth groove 52 are cut in the second face of wafer 10 at a second predetermined distance 42 from center line 20. Fifth and sixth grooves 50, 52 are parallel to both third and fourth reference cuts 16, 18.

Next, additional grooves are cut to create the second set of crosshairs which will be used for aligning a mask on the second face of the wafer. As shown in FIG. 7, saw 8 is positioned with an orientation such that it cuts parallel to first and second reference cuts 12, 14, and is displaced from second reference cut 14 by a displacement 46. As discussed above, displacement 46 may have a length equal to the second predetermined distance 26 and, may be equal in length to displacement 42. In the preferred embodiment, to form these grooves, wafer 10 is rotated by a quarter turn and saw 8 is positioned as described above. Once saw 8 is positioned, the crosshairs are created by cutting a seventh groove 54 and an eighth groove 56, as shown in FIG. 7, which is analogous to FIG. 4. Again, in the exemplary method shown, saw 8 is first positioned over third reference cut 16 and seventh groove 54 is cut toward the center of wafer 10 such that the cut extends past fifth groove 50. Next saw 8 is positioned over fourth reference cut 18 and eighth groove 56 is cut toward the center of wafer 10 such that the cut extend past sixth groove 52. Seventh groove 54 will be perpendicular to fifth groove 50 and eighth groove 56 will be perpendicular to sixth groove 32. In the preferred embodiment the sizes of the grooves are the same as those created in the first face, and the manner of rotating substrate 10 and translating saw 8 is the same.

The above method produces pairs of crosshair patterns on opposite faces of a substrate. These crosshair patterns permit precise alignment of masks used to form patterns on the faces of the substrate. Because the respective locations of these crosshair patterns on both faces are determined by predetermined distances from common reference cuts in the substrate, the crosshairs are aligned on opposite faces. In some embodiments these crosshairs may be directly opposite one another, which would be accomplished by setting the first and second predetermined distances to be equal. However, cutting grooves over the same location on opposite sides of the substrate may lead to mechanical weakness and possible breakage of the substrate. Hence, in the preferred embodiment of the method of the present invention, the first and second predetermined distances are different to provide an offset of crosshair patterns. Such a configuration is illustrated in FIG. 8, where the crosshair alignment grooves on the first face of the wafer are shown by solid lines and the crosshair alignment grooves on the second side of the wafer are shown by dashed lines. Masks for the opposite sides would be appropriately designed to be aligned by the crosshair patterns determined by the selected predetermined distances.

Figure 9:
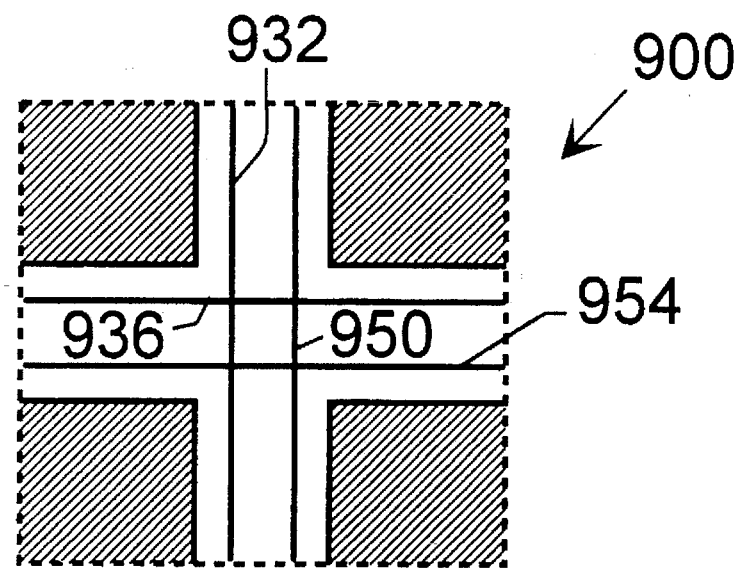
FIG. 9 illustrates a mask alignment pattern for use with the offset crosshair patterns of the present invention.

When using the same pattern on both sides of a wafer, a single mask may be all that is required. In such a case, the mask may have pairs of corresponding crosshairs that are offset, one pair of crosshairs being provided for each side of the substrate. The portion of such a mask 900 used for alignment is shown in FIG. 9. In this figure, crosshairs 932 and 936 are aligned with crosshair alignment grooves 32, 36 when the mask is used with the first side of the substrate, and crosshairs 950 and 954 are aligned with crosshair alignment grooves 50, 54 when the mask is used with the second side of the substrate.

The preferred method of the present invention uses a center reference line to ensure that the alignment marks are precisely located on the wafer surfaces. This, in turn, enables the mask to be precisely centered on the wafer surface, thereby facilitating optimal usage of the wafer surface. In circumstances where optimal wafer surface utilization is not as important, the present invention may be carried out without the step of calculating or otherwise determining the location of center line 20. For example, first and second grooves 30 and 32 may be positioned by measuring and forming grooves at first and second predetermined distances from the third (or fourth) references cut 16 (or 18). Fourth and fifth grooves may be formed on the opposite side of the wafer in a similar manner, measuring from the same reference cut used in connection with the formation of the first and second grooves. By referencing the grooves to the same reference cut an absolute distance between them is maintained, although them is less precision as to the position of the cuts relative to the exact center of the wafer. Third, fourth, seventh and eighth grooves (34, 36, 54, 56) may then be formed as described above. Again, the grooves on opposite sides of the wafer are preferably offset to minimize the risk of mechanical failure.

Likewise, if reduced precision is acceptable, one may use a predetermined reference position on the edge of the water to make measurements, without need to make any reference cuts. Such a predetermined wafer position may, for example, be the center of a preexisting wafer flat, or another selected position on the edge of a wafer. Alternatively, a single reference cut may be made and used for all further measurements. In such cases, one must rely, in part, on the fact that the dimensions of the substrate are known with acceptable precision. This approach also relies, in part, on the fact that the saw used to cut grooves may be rotated an appropriate amount, e.g., ninety degrees, with sufficient accuracy. Accuracies to within approximately one hundred microns have been obtained using this approach.

While specific preferred embodiments of the elements of the present invention have been illustrated above, various modifications of the invention beyond those shown and described herein will become apparent to those skilled in the art from the foregoing description and accompanying drawings. Such modifications are intended to fall within the scope of the following claims.

What is claimed is:

1. A method for producing alignment marks on opposite faces of a generally flat substrate comprising the steps of:

producing a first pair of grooves in a first face of the substrate, each groove of said first pair being positioned on opposite sides of said first face, said first pair of grooves being parallel to each other and spaced at predetermined distances from and having predetermined orientations relative to a predetermined reference position on an edge of the substrate;

producing a second pair of grooves perpendicular to said first pair of grooves, wherein each groove of said second pair of grooves intersects only a respective one groove of said first pair, the positions of intersection of said grooves being spaced at a predetermined distance from said reference position;

producing a third pair of grooves in a second face of the substrate opposite said first face, each groove of said third pair being positioned on opposite sides of said second face, said third pair of grooves being parallel to each other and spaced at predetermined distances from and having predetermined orientations relative to said reference position; and producing a fourth pair of grooves perpendicular to said third pair of grooves, wherein each groove of said fourth pair of grooves intersects only a respective one groove of said third pair, the positions of intersection of said grooves being spaced at a predetermined distance from said reference position.

2. The method of claim 1 wherein said reference position is a reference cut.

3. A method for producing alignment marks on opposite faces of a generally flat substrate having a first reference cut having a clean edge, said method comprising the steps of:

producing a second reference cut on the substrate parallel to, and on an edge of the substrate opposite from, said first reference cut;

producing third and fourth reference cuts in the substrate perpendicular to said first and said second reference cuts, said third and fourth reference cuts being parallel to one another on opposite edges of the substrate;

determining a first center line on a first face of the substrate between said third and said fourth reference cuts and parallel thereto;

cutting first and second grooves in said first face of the substrate a first predetermined distance from said first center line, said first and second grooves being parallel to said third and said fourth reference cuts;

cutting third and fourth grooves in said first face of the substrate perpendicular to said first and second grooves and at said first predetermined distance from said second reference cut, said third groove being cut through said first groove, and said fourth groove being cut through said second groove;

determining a second center line on a second face of the substrate between said third and said fourth reference cuts and parallel thereto;

cutting fifth and sixth grooves in said second face of the substrate a second predetermined distance from said second center line, said fifth and sixth grooves being parallel to said third and said fourth reference cuts; and cutting seventh and eighth grooves in said second face of the substrate perpendicular to said fifth and sixth grooves and at said second predetermined distance from said second reference cut, said seventh groove being cut through said fifth groove, and said eighth groove being cut through said sixth groove.

4. A method for producing alignment marks on opposite faces of a wafer having a first reference cut having a clean edge, said method comprising the steps of:

producing a second reference cut on the wafer parallel to and on an edge of the wafer opposite from said first reference cut;

producing third and fourth reference cuts on the wafer perpendicular to said first and said second reference cuts, said third and fourth reference cuts being parallel to one another and on opposite edges of the wafer;

determining a first center line on a first face of the wafer between said third and said fourth reference cuts and parallel thereto;

cutting first and second grooves in said first face of the wafer a first predetermined distance from said first center line, said first and second grooves being parallel to said third and said fourth reference cuts;

cutting third and fourth grooves in said first face of the wafer perpendicular to said first and second grooves and at said first predetermined distance from said second reference cut, said third groove being cut through said first groove and said fourth groove being cut through said second groove;

determining a second center line on a second face of the wafer between said third and said fourth reference cuts and parallel thereto;

curing fifth and sixth grooves in said second face of the wafer a second predetermined distance from said second center line, said fifth and sixth grooves being parallel to said third and said fourth reference cuts; and cutting seventh and eighth grooves in said second face of the wafer perpendicular to said fifth and sixth grooves and at said second predetermined distance from said second reference cut, said seventh groove being cut through said fifth groove and said eighth groove being cut through said sixth groove.

5. The method of claim 4 wherein said first and said second predetermined distances are the same.

6. A method for producing alignment marks on opposite faces of a wafer, said method comprising the steps of:

producing a first reference cut on the wafer, said first reference cut having a clean edge;

producing a second reference cut on the wafer parallel to and on an edge of the wafer opposite from said first reference cut;

rotating the water a quarter turn;

producing third and fourth reference cuts parallel to one another and on opposite edges of the wafer;

determining true center of the wafer on a first face of the wafer between said third and said fourth reference cuts;

cutting first and second grooves in said first face of the wafer a first predetermined distance from said true center of the wafer, said first and second grooves being parallel to said third and said fourth reference cuts;

rotating the wafer a quarter turn;

cutting third and fourth grooves in said first face of the wafer at said first predetermined distance from said second reference cut, said third groove being cut through said first groove and said fourth groove being cut through said second groove;

determining said true center of the wafer on a second face of the wafer between said third and said fourth reference cuts;

rotating the wafer a quarter turn;

cutting fifth and sixth grooves in said second face of the wafer a second predetermined distance from said true center of the wafer, said fifth and sixth grooves being parallel to said third and said fourth reference cuts;

rotating the wafer a quarter turn;
cutting seventh and eighth grooves in said second face of the wafer at said second predetermined distance from said second reference cut, said seventh groove being cut through said fifth groove and said eighth groove being cut through said sixth groove.

* * * * *

UNITED STATES PATENT AND TRADEMARK OFFICE
CERTIFICATE OF CORRECTION

PATENT NO. : 5,580,831
DATED : December 3, 1996
INVENTOR(S) : James J. Roman

It is certified that error appears in the above-indentified patent and that said Letters Patent is hereby corrected as shown below:

Column 5, line 2, delete "extend" and insert therefor --extends--.

Column 5, line 47, delete "extend" and insert therefor --extends--.

Column 5, line 49, delete "32" and insert therefor --52--.

Column 6, line 36, delete "them" and insert therefor --there--.

Signed and Sealed this

Twenty-fourth Day of June, 1997

Attest:

BRUCE LEHMAN

*Attesting Officer*     *Commissioner of Patents and Trademarks*